US008332177B2

(12) United States Patent
Liang et al.

(10) Patent No.: US 8,332,177 B2
(45) Date of Patent: Dec. 11, 2012

(54) SYSTEM AND METHOD FOR TESTING A CHARACTERISTIC IMPEDANCE OF A SIGNAL PATH ROUTING OF A PRINTED CIRCUIT BOARD

(75) Inventors: Hsien-Chuan Liang, Taipei Hsien (TW); Shen-Chun Li, Taipei Hsien (TW); Shou-Kuo Hsu, Taipei Hsien (TW); Yung-Chieh Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 475 days.

(21) Appl. No.: 12/732,201

(22) Filed: Mar. 26, 2010

(65) Prior Publication Data

US 2010/0332169 A1 Dec. 30, 2010

(30) Foreign Application Priority Data

Jun. 26, 2009 (CN) .......................... 2009 1 0303765

(51) Int. Cl.
*G06F 11/30* (2006.01)
*G06F 19/00* (2011.01)
*G06F 17/40* (2006.01)
*G01R 31/02* (2006.01)
*G01R 31/28* (2006.01)

(52) U.S. Cl. ...... 702/119; 73/865.8; 73/866.3; 324/525; 324/600; 324/615; 324/763.01; 340/653; 702/58; 702/123; 702/183; 702/187; 702/189

(58) Field of Classification Search ................. 73/865.8, 73/865.9, 866.3; 324/500, 512, 525, 534, 324/537, 600, 612, 615, 750.01, 754.01, 324/754.03, 754.1, 754.19; 340/500, 540, 324/635, 649, 650, 651, 652, 653; 702/1, 702/57, 58, 108, 117, 119, 123, 127, 182, 702/183, 187, 189

See application file for complete search history.

(56) References Cited

U.S. PATENT DOCUMENTS

| | | | | |
|---|---|---|---|---|
| 2,586,319 A * | 2/1952 | Foote | ............................. | 324/525 |
| 2,610,229 A * | 9/1952 | Cranford | ....................... | 324/542 |
| 2,839,723 A * | 6/1958 | De Armond | ................... | 324/555 |
| 2,874,351 A * | 2/1959 | Lamont | ......................... | 324/706 |
| 2,887,622 A * | 5/1959 | Rayburn et al. | ................ | 361/189 |
| 2,950,437 A * | 8/1960 | Stahl | .............................. | 324/73.1 |
| 3,082,374 A * | 3/1963 | Buuck | ........................... | 324/73.1 |
| 3,086,170 A * | 4/1963 | Kemelhor et al. | ............. | 324/713 |
| 3,094,212 A * | 6/1963 | Moore et al. | ................... | 209/548 |
| 3,134,077 A * | 5/1964 | Hutchins, IV et al. | ............ | 330/2 |

(Continued)

FOREIGN PATENT DOCUMENTS

CN 1666109 A 9/2005

(Continued)

*Primary Examiner* — Edward Cosimano
(74) *Attorney, Agent, or Firm* — Altis Law Group, Inc.

(57) ABSTRACT

A method for testing a characteristic impedance of a signal path routing of a printed circuit board (PCB) controls the test device to test a characteristic impedance of the signal path routing of the PCB to get test data of the signal path routing of the PCB. The method further analyzes the test data of the signal path routing of the PCB get analysis results, generate a test report for storing the test data of each signal path routing of the PCB and the analysis results if all signal path routings of the PCB have been tested.

15 Claims, 3 Drawing Sheets

U.S. PATENT DOCUMENTS

| | | | |
|---|---|---|---|
| 3,441,849 A * | 4/1969 | Harring et al. | 324/512 |
| 5,479,610 A * | 12/1995 | Roll-Mecak et al. | 714/25 |
| 6,791,336 B2 * | 9/2004 | Krigel | 324/539 |
| 7,800,385 B2 * | 9/2010 | McElfresh et al. | 324/763.01 |
| 2003/0006779 A1 * | 1/2003 | Youval | 324/503 |
| 2005/0240831 A1 * | 10/2005 | Balkman et al. | 714/46 |
| 2009/0230976 A1 * | 9/2009 | McElfresh et al. | 324/538 |

FOREIGN PATENT DOCUMENTS

CN 1952673 A 4/2007

* cited by examiner

SYSTEM AND METHOD FOR TESTING A CHARACTERISTIC IMPEDANCE OF A SIGNAL PATH ROUTING OF A PRINTED CIRCUIT BOARD

BACKGROUND

1. Technical Field

Embodiments of the present disclosure relate to test technology, and particularly to a system and method for testing a characteristic impedance of a signal path routing of a printed circuit board (PCB).

2. Description of Related Art

Characteristic impedance testing of signal path routings of a PCB is an important phase in the manufacturing process, and is closely interrelated to product quality. For further improvements to the impedance characterization of signal routings, a prompt and accurate test of characteristic impedances of the signal path routings on the PCB is desirable.

DETAILED DESCRIPTION

All of the processes described below may be embodied in, and fully automated via, functional code modules executed by one or more general purpose computers or processors. The code modules may be stored in any type of readable medium or other storage device. Some or all of the methods may alternatively be embodied in specialized hardware. Depending on the embodiment, the readable medium may be a hard disk drive, a compact disc, a digital video disc, or a tape drive.

Figure 1:
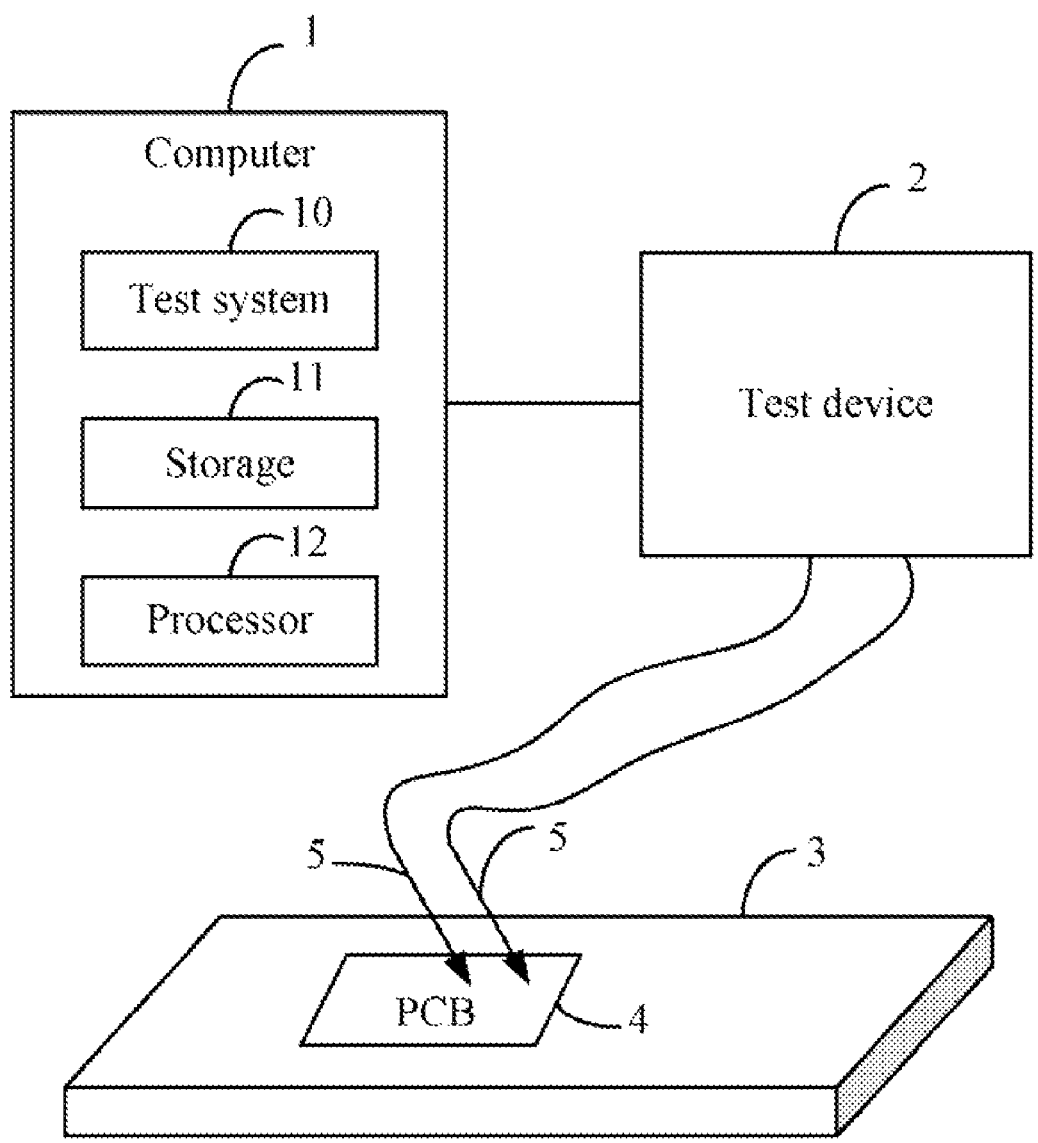
FIG. 1 is a schematic diagram of one embodiment of a computer including a testing system for testing a characteristic impedance of a signal path routing of a printed circuit board (PCB).

FIG. 1 is a schematic diagram of one embodiment of a computer 1 including a test system 10. In one embodiment, the computer 1 is connected to a test device 2, where the test device 2 may be a time domain reflectometer (TDR), for example. The test device 2 selects a signal path routing of a printed circuit board (PCB) 4 via probes 5, and tests a characteristic impedance of each of the signal path routings of the PCB 4. The PCB 4 is positioned on a test platform 3. Referring to FIG. 1, the test system 10 may be used to obtain test parameters of each of the signal path routings, control the test device 2 to test the characteristic impedance of each of the signal path routings according to the test parameters, obtain test data, and analyze the test data.

The computer 1 further includes a storage 11 and a processor 12. The storage 11 can be a hard disk drive, random access, memory, read only memory, a cache system or a combination of the aforementioned systems. The storage 11 may store various kinds of data, such as the test information. The test parameters of each of the signal path routing of the PCB 4, and the test data, for example. The processor 12 executes one or more computerized operations of the computer 1 and other applications, to provide functions of the computer 1.

Figure 2:
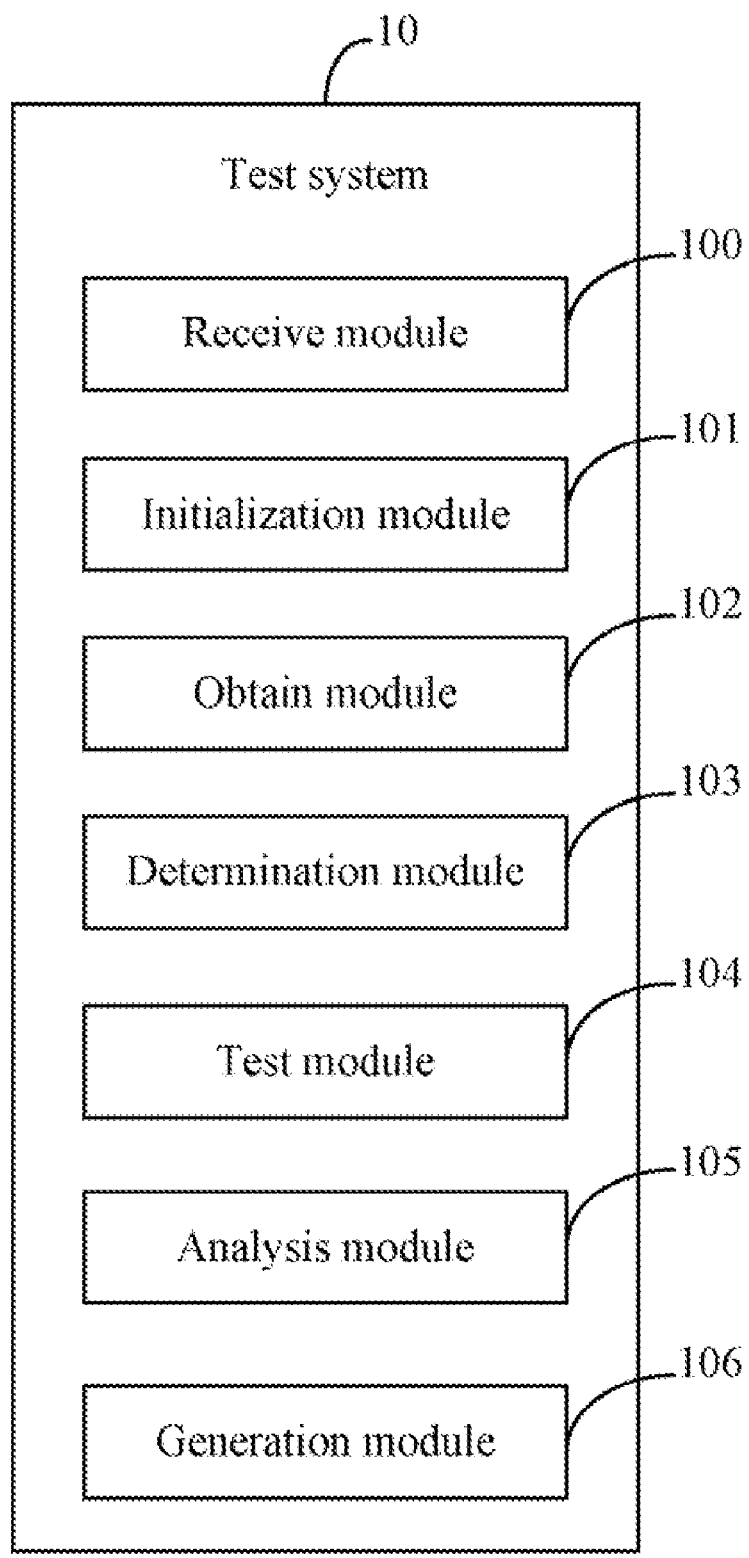
FIG. 2 is a block diagram of one embodiment of the test system in the FIG. 1.

FIG. 2 is a block diagram of one embodiment of the test system 10 in the FIG. 1. In one embodiment, the test system 10 includes a receiving module 100, an initializing module 101, an obtaining module 102, a determining module 103, a test module 104, an analysis module 105, and a generation module 106. The modules 100, 101, 102, 103, 104, 105, and 106 may comprise one or more computerized codes to be executed by the processor 12 to perform one or more operations of the test system 1.

The receiving module 100 receives test information. The test information may include an Internet Protocol address of the test device 2, a preset storage path for storing the test parameters in the storage 11, and a preset storage path for storing the test data in the storage 11.

The initialization module 101 initializes the test device 2 connected to the computer 1. In one embodiment, the initialization module 101 initializes the test device 2 by restoring the test device 2 to its factory settings.

The obtaining module 102 obtains status parameters of the test device 2. In one embodiment, the status parameters of the test device 2 includes a temperature of the test device 2 and a probe parameter that determines whether probes 5 of the test device 2 are available probes. If the probes 5 of the test device 2 can select a signal path routing of the PCB 4, the probes 5 of the test device 2 are available probes.

The determination module 103 determines whether the obtained status parameters are valid. In one embodiment, the storage 11 stores standard temperature of the test device 2. If the obtained temperature of the test device 2 is within range of the standard temperature of the test device 2, and if the probes of the test device 2 are available probes, the determination module 103 determines that the obtained status parameters are valid. If the obtained temperature of the test device 2 is not within range of the standard temperature of the test device 2, and/or the probes of the test device 2 are not available probes, the determination module 103 determines that the obtained status parameters are invalid.

If the status parameters of the test device 2 are valid, the obtaining module 102 obtains test parameters of each signal path routing of the PCB 4 according to the preset storage path that stores the test parameters in the storage 11. The test parameters of each signal path routing includes a name, a type, a length, and a standard characteristic impedance of the signal path routing.

The testing module 104 controls the test device 2 to test the characteristic impedance of a signal path routing of the PCB 4 according to the test parameters, obtain test data of the signal path routing from the test device 2, and store the test data of the signal path routing in the storage 11.

The analysis module 105 compares the test data of the signal path routing of the PCB 4 with a corresponding standard characteristic impedance of the signal path routing in the test parameters, and determines if the test data of the signal path routing is acceptable. If the test data of the signal path routing is within the standard characteristic impedance of the signal path routing, the test data of the signal path routing is acceptable. If the test data of the signal path routing is not within the standard characteristic impedance of the signal path routing, the test data of the signal path routing is not acceptable.

The determination module 103 determines whether any other signal path routings of the PCB 4 need to be tested.

The generation module 106 generates a test report to store the test data and the comparison results if there are no signal path routing of the PCB 4 needs to be tested, and stores the test report in the storage 11 according to the test information.

Figure 3:
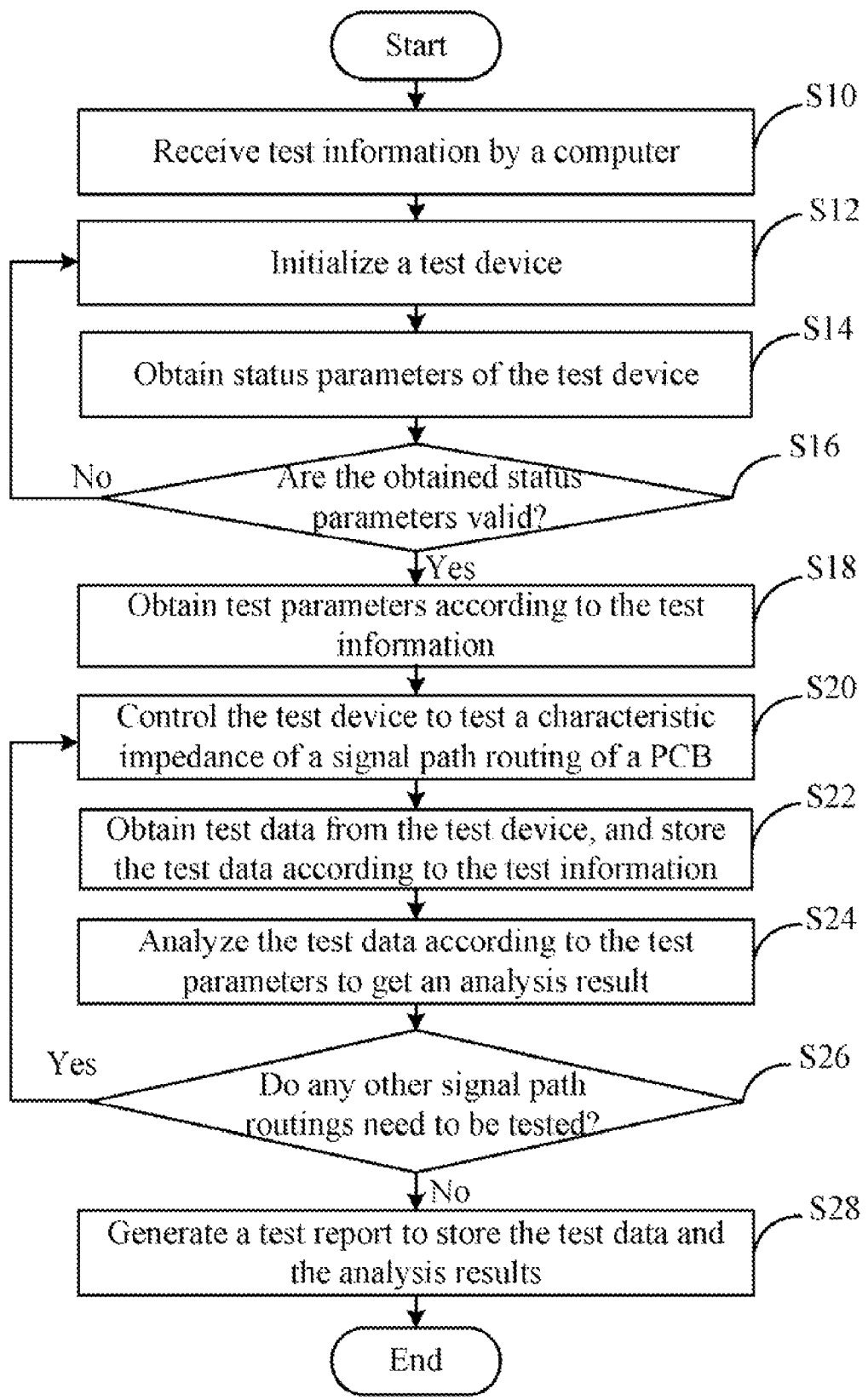
FIG. 3 is a flowchart of one embodiment of a method for testing a characteristic impedance of a signal path routing of a PCB using the test system of FIG. 2.

FIG. 3 is a flowchart of one embodiment of a method for testing a characteristic impedance of a signal path routing of a PCB. Depending on the embodiment, additional blocks may be added, others removed, and the ordering of the blocks may be changed.

In block S10, the receiving module 100 receives test information by the computer 1.

In block S12, the initialization module 101 initializes the test device 2 connected to the computer 1.

In block S14, the obtaining module 102 obtains status parameters of the test device 2. The status parameters of the test device 2 includes the temperature of the test device 2 and a probe parameter that determines whether the probes 5 of the test device 2 are available probes.

In block S16, the determination module 103 determines whether the obtained status parameters are valid. The storage 11 stores standard temperature of the test device 2. If the obtained temperature of the test device 2 is within range of the standard temperature of the test device 2, and the probes of the test device 2 are available probes, the determination module 103 determines that the obtained status parameters are valid. If the obtained temperature of the test device 2 is not within range of the standard temperature of the test device 2, and/or the probes of the test device 2 are not available probes, the determination module 103 determines that the obtained status parameters are invalid.

In block S18, if the status parameters of the test device are valid, the obtaining module 102 obtains test parameters of signal path routings of the PCB 4 according to the preset storage path that stores the test parameters in the storage 11. The test parameters of each signal path routing comprises a name, a type, a length, and a standard characteristic impedance of the signal path routing. Otherwise, if the status parameters of the test device are invalid, the procedure returns to block S12 described above.

In block S20, the testing module 104 controls the test device 2 to test the characteristic impedance of a signal path routing of the PCB 4 according to the test parameters.

In block S22, the testing module 104 obtains test data of the signal path routing from the test device 2, and stores the test data of the signal path routing in the storage 11.

In block S24, the analyzing module 105 compares the test data of the signal path routing of the PCB 4 with a corresponding standard characteristic impedance of the signal path routing in the test parameters, and determines if the test data of the signal path routing is acceptable. If the test data of the signal path routing is within the standard characteristic impedance of the signal path routing, the test data of the signal path routing is acceptable. If the test data of the signal path routing is not within the standard characteristic impedance of the signal path routing, the test data of the signal path routing is not acceptable.

In block S26, the determination module 103 determines whether any other signal path routings of the PCB 4 need to be tested.

In block S28, if there are no signal path routings of the PCB 4 that need to be tested, the generation module 106 generates a test report and the comparison results and stores the test report in the storage 11 according to the test information. Otherwise, if there are signal path routings of the PCB 4 that need to be tested, the procedure returns to block S20 described above.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer system for testing a characteristic impedance of a signal path routing of a printed circuit board (PCB), the computer system comprising:
   a storage;
   at least one processor; and
   one or more programs stored in the storage and being executable by the at least one processor, the one or more programs comprising:
   a receiving module operable to receive test information;
   an initialization module operable to initialize a test device connected to the computer system;
   an obtaining module operable to obtain status parameters of the test device, obtain test parameters of the signal path routing of the PCB according to the test information if the status parameters of the test device are valid, and store the test parameters of the signal path routing of the PCB in the storage;
   a test module operable to control the test device to test a characteristic impedance of the signal path routing of the PCB according to the test parameters, obtain test data of the signal path routing of the PCB from the test device, and store the test data of the signal path routing of the PCB in the storage;
   an analysis module operable to compare the test data of the signal path routing of the PCB with a corresponding standard characteristic impedance in the test parameters, and determine if the test data of the signal path routing of the PCB is acceptable;
   a generation module operable to generate a test report to store the test data of each signal path routing of the PCB and corresponding comparison result if all signal path routings of the PCB have been tested, and store the test report in the storage.

2. The computer system according to claim 1, wherein the test information comprises an Internet Protocol address of the test device, a preset storage path for storing the test parameters in the storage, and a preset storage path for storing the test data in the storage.

3. The computer system according to claim 1, wherein the status parameters of the test device comprise a temperature of the test device and a probe parameter that determines whether probes of the test device are available probes.

4. The computer system according to claim 1, wherein the test parameters of the signal path routing comprises a name, a type, a length, and the standard characteristic impedance of the signal path routing.

5. The computer system according to claim 1, wherein the analysis module determines that the test data of a signal path routing is acceptable if the test data of the signal path routing is within range of the standard characteristic impedance of the signal path routing, or determines that the test data of a signal path routing is not acceptable if the test data of the signal path routing is not within range of the standard characteristic impedance of the signal path routing.

6. A computer-implemented method for testing a characteristic impedance of a signal path routing of a printed circuit board (PCB), the method comprising:
   receiving test information;
   initializing a test device connected to a computer;
   obtaining status parameters of the test device;
   obtaining test parameters of the signal path routing of the PCB according to the test information if the status parameters of the test device are valid, and storing the test parameters of the signal path routing of the PCB in a storage of the computer;

controlling the test device to test a characteristic impedance of the signal path routing of the PCB according to test parameters;

obtaining test data of the signal path routing of the PCB from the test device, and storing the test data of the signal path routing of the PCB in the storage;

comparing the test data of the signal path routing of the PCB with a corresponding standard characteristic impedance in the test parameters, and determine if the test data of the signal path routing of the PCB is acceptable;

generating a test report to store the test data of each signal path routing of the PCB and corresponding comparison result if all signal path routings of the PCB have been tested, and storing the test report in the storage.

7. The method according to claim 6, wherein the test information comprises an Internet Protocol address of the test device, a preset storage path for storing the test parameters in the storage, and a preset storage path for storing the test data in the storage.

8. The method according to claim 6, wherein the status parameters of the test device comprise a temperature of the test device and a probe parameter that determines whether probes of the test device are available probes.

9. The method according to claim 6, wherein the test parameters of the signal path routing comprises a name, a type, a length, and the standard characteristic impedance of the signal path routing.

10. The method according to claim 6, wherein the test data of a signal path routing is acceptable if the test data of the signal path routing is within range of the standard characteristic impedance of the signal path routing, or the test data of a signal path routing is not acceptable if the test data of the signal path routing is not within range of the standard characteristic impedance of the signal path routing.

11. A storage medium having stored thereon instructions that, when executed by a processor, cause the processor to perform a method for testing a characteristic impedance of a signal path routing of a printed circuit board (PCB), the method comprising:

receiving test information;

initializing a test device connected to a computer;

obtaining status parameters of the test device;

obtaining test parameters of the signal path routing of the PCB according to the test information if the status parameters of the test device are valid, and storing the test parameters of the signal path routing of the PCB in a storage of the computer;

controlling the test device to test a characteristic impedance of the signal path routing of the PCB according to test parameters;

obtaining test data of the signal path routing of the PCB from the test device, and storing the test data of the signal path routing of the PCB in the storage;

comparing the test data of the signal path routing of the PCB with a corresponding standard characteristic impedance in the test parameters, and determine if the test data of the signal path routing of the PCB is acceptable;

generating a test report to store the test data of each signal path routing of the PCB and corresponding comparison result if all signal path routings of the PCB have been tested, and storing the test report in the storage.

12. The storage medium according to claim 11, wherein the test information comprises an Internet Protocol address of the test device, a preset storage path for storing the test parameters in the storage, and a preset storage path for storing the test data in the storage.

13. The storage medium according to claim 11, wherein the status parameters of the test device comprise a temperature of the test device and a probe parameter that determines whether probes of the test device are available probes.

14. The storage medium according to claim 11, wherein test parameters of the signal path routing comprises a name, a type, a length, and the standard characteristic impedance of the signal path routing.

15. The storage medium according to claim 11, wherein the test data of a signal path routing is acceptable if the test data of the signal path routing is within range of the standard characteristic impedance of the signal path routing, or the test data of a signal path routing is not acceptable if the test data of the signal path routing is not within range of the standard characteristic impedance of the signal path routing.

* * * * *